(12) United States Patent
Ao et al.

(10) Patent No.: US 7,916,118 B2
(45) Date of Patent: Mar. 29, 2011

(54) PRINTED CIRCUIT BOARD MODULE WITH SINGLE AND DOUBLE LAYER PRINTED CIRCUIT BOARDS

(75) Inventors: Hsien-Jung Ao, Miao-Li (TW); Hong-Fu Zhou, Shenzhen (CN); Jin-Xun Liu, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 987 days.

(21) Appl. No.: 11/800,200

(22) Filed: May 4, 2007

(65) Prior Publication Data

US 2007/0257899 A1    Nov. 8, 2007

(30) Foreign Application Priority Data

May 5, 2006    (TW) ................. 95115996 A

(51) Int. Cl.
*G09G 3/36*    (2006.01)
(52) U.S. Cl. .......................... 345/102; 345/87
(58) Field of Classification Search ............ 345/87, 345/102, 104, 905; 175/154; 365/200; 439/95; 216/17; 178/18.07
See application file for complete search history.

(56) References Cited

U.S. PATENT DOCUMENTS

| | | | |
|---|---|---|---|
| 5,309,326 A | 5/1994 | Minoru | |
| 5,506,375 A * | 4/1996 | Kikuchi | 178/18.07 |
| 5,587,557 A | 12/1996 | Kurihara et al. | |
| 5,825,084 A * | 10/1998 | Lau et al. | 257/700 |
| 6,674,652 B2 * | 1/2004 | Forte et al. | 361/800 |
| 6,958,941 B2 * | 10/2005 | Honda | 365/189.15 |
| 7,086,871 B2 * | 8/2006 | Park | 439/78 |
| 7,385,143 B2 * | 6/2008 | Ho et al. | 174/254 |
| 7,488,428 B2 * | 2/2009 | Lee et al. | 216/17 |
| 2001/0008483 A1 * | 7/2001 | Lee et al. | 361/790 |
| 2003/0104715 A1 * | 6/2003 | Tsai et al. | 439/95 |
| 2003/0231533 A1 * | 12/2003 | Honda | 365/200 |
| 2004/0195010 A1 * | 10/2004 | Fielding | 177/154 |
| 2005/0011677 A1 * | 1/2005 | Yoshino et al. | 174/263 |
| 2006/0077645 A1 * | 4/2006 | Yang | 361/769 |

FOREIGN PATENT DOCUMENTS

| | | |
|---|---|---|
| TW | 594174 B | 6/2004 |
| TW | 595282 B | 6/2004 |

* cited by examiner

*Primary Examiner* — Nitin Patel
(74) *Attorney, Agent, or Firm* — Wei Te Chung

(57) ABSTRACT

An exemplary printed circuit board (PCB) module (20) used in a liquid crystal display (LCD) includes a single-layer PCB (31) and a double-layer PCB (32) configured to be electrically connected to the single-layer PCB. The single-layer PCB includes a first part of a signal processing circuit (23). The double-layer PCB includes a second part of the signal processing circuit (23).

14 Claims, 3 Drawing Sheets

PRINTED CIRCUIT BOARD MODULE WITH SINGLE AND DOUBLE LAYER PRINTED CIRCUIT BOARDS

FIELD OF THE INVENTION

The present invention relates to PCB (printed circuit board) modules such as those used in LCDs (liquid crystal displays); and more particularly to a PCB module having a double-layer PCB and a single-layer PCB, and an LCD (liquid crystal display) using such PCB module.

GENERAL BACKGROUND

An LCD has the advantages of portability, low power consumption, and low radiation, and has been widely used in various portable information products such as notebooks, PDAs (personal digital assistants), video cameras and the like. Furthermore, the LCD is considered by many to have the potential to completely replace CRT (cathode ray tube) monitors and televisions.

Normally, an LCD includes an LCD panel, a backlight module configured for illuminating the LCD panel, and a PCB module configured for providing operation voltages respectively to the LCD panel and the backlight module. The PCB module can also receive image signals from an external circuit such as a computer, and transform the image signals into image driving data. The image driving data drive the LCD panel of the LCD to display corresponding images.

FIG. 4 is a block diagram of a typical PCB module which can be used in an LCD. The PCB module 10 includes a power source circuit 11 configured for outputting operation voltages, a backlight control circuit 12 configured for driving a backlight of the LCD, and a signal processing circuit 13 configured for receiving image signals from an external circuit (not shown) such as a computer or a DVD (digital video disc) player. The signal processing circuit 13 transforms the image signals into image data that an LCD panel of the LCD can receive, and then transmits the image data to the LCD panel.

FIG. 5 is a circuit diagram of the signal processing circuit 13. The signal processing circuit 13 includes a crystal oscillating circuit 130, a low voltage transformer 131, a voice-frequency circuit 132, a scaler 133, an MCU (micro controller unit) 134, an EDID (extended display identification data) memory 135, a work mode memory 136, a video input interface circuit 137, a panel interface circuit 138, and a keyboard interface circuit 139.

Operation voltages generated by the power source circuit 11 are provided to the low voltage transformer 131, the panel interface circuit 138, the MCU 134, and the voice-frequency circuit 132. The low voltage transformer 131 provides voltages to the scaler 133.

The video input interface circuit 137 receives video signals and a symbol signal from the external circuit, and respectively provides the video signals and the symbol signal to the scaler 133 and the EDID memory 135.

The scaler 133 receives the video signals from the video input interface circuit 137, and decodes the video signals into image data and sound signals. The image data are provided to the panel interface circuit 138. The sound signals are provided to the voice-frequency circuit 132.

The voice-frequency circuit 132 transforms the sound signals into audible sounds (including voice) using a speaker (not shown). Operation of the voice-frequency circuit 132 is controlled by the MCU 134.

The EDID memory 135 stores symbol information of the LCD. The EDID memory 135 also receives the symbol signal from the video input interface circuit 137, and provides the symbol information and the symbol signal to the MCU 134. The MCU 134 compares and identifies the symbol information and the symbol signal.

The work mode memory 136 stores parameters which corresponds to at least one work mode of the LCD. The parameters can be provided to the MCU 134, thus the MCU 134 can adjust the work mode of the LCD.

The keyboard interface circuit 139 receives an interrupt signal from an adjusting button of the LCD when the adjusting button is pressed by a user. The interrupt signal is then provided to the MCU 134. Thus the contrast, brightness, and vertical and horizontal sizes of images displayed by an LCD panel of the LCD can be adjusted or changed by the MCU 134 when the user pushes the adjusting button and thus generates the interrupt signal.

The crystal oscillating circuit 130 generates a pulse clock signal having a state frequency, and provides the pulse clock signal to the MCU 134 and the scaler 133.

The panel interface circuit 138 provides the image data received from the scaler 133 and the operation voltages received from the power source circuit 11 to the LCD panel.

Normally, the signals that the signal processing circuit 13 deals with are digital signals each having high frequencies. In order to depress or eliminate interference between different digital signals that have different high frequencies, the PCB module 10 is typically constituted in a double-layer PCB. Because the cost of the double-layer PCB is high, the cost of the PCB module 10 is correspondingly high. Furthermore, because the signal processing circuit 13 is integrated in the double-layer PCB, when one of internal circuits of the signal processing circuit 13 such as the scaler 133 needs to be changed, a layout of the signal processing circuit 13 or even of the entire PCB module 10 needs to be redesigned. The need to change one of the internal circuits may arise, for example, when the PCB module 10 is to be used together with another type of LCD panel in mass manufacturing. In this respect at least, the PCB module 10 having the signal processing circuit 13 can be considered to increase the cost of mass manufacturing different kinds of LCDs having different LCD panels.

It is desired to provide a PCB module which can overcome the above-described deficiencies.

SUMMARY

In one preferred embodiment, a PCB module used in an LCD includes a single-layer PCB and a double-layer PCB configured to be electrically connected to the single-layer PCB. The single-layer PCB includes a first part of a signal processing circuit. The double-layer PCB includes a second part of the signal processing circuit.

Other novel features and advantages will become more apparent from the following detailed description when taken in conjunction with the accompanying drawings.

DETAILED DESCRIPTION OF PREFERRED EMBODIMENTS

Reference will now be made to the drawings to describe various embodiments of the present invention in detail.

Figure 1:
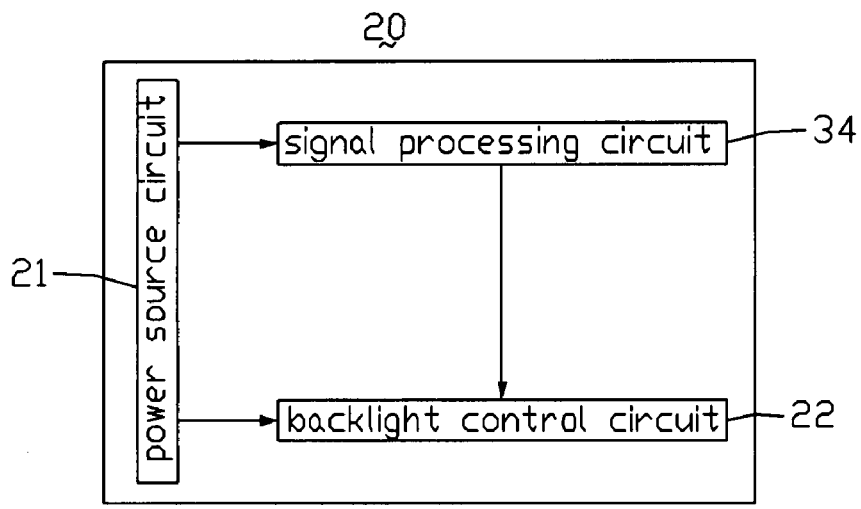
FIG. 1 is a block diagram showing circuits of a PCB module according to an exemplary embodiment of the present invention, the circuits including a signal processing circuit.

FIG. 1 is a block diagram of a PCB module according to an exemplary embodiment of the present invention. The PCB module 20 is typically used in an LCD (not shown), which includes an LCD panel (not shown) and a backlight (not shown). The PCB module 20 includes a power source circuit 21 configured for outputting operation voltages, a backlight control circuit 22 configured for driving the backlight, and a signal processing circuit 34 configured for receiving image signals from an external circuit such as a computer or a DVD player. The signal processing circuit 34 transforms the image signals into image data that the LCD panel can receive, and then transmits the image data to the LCD panel.

Figure 2:
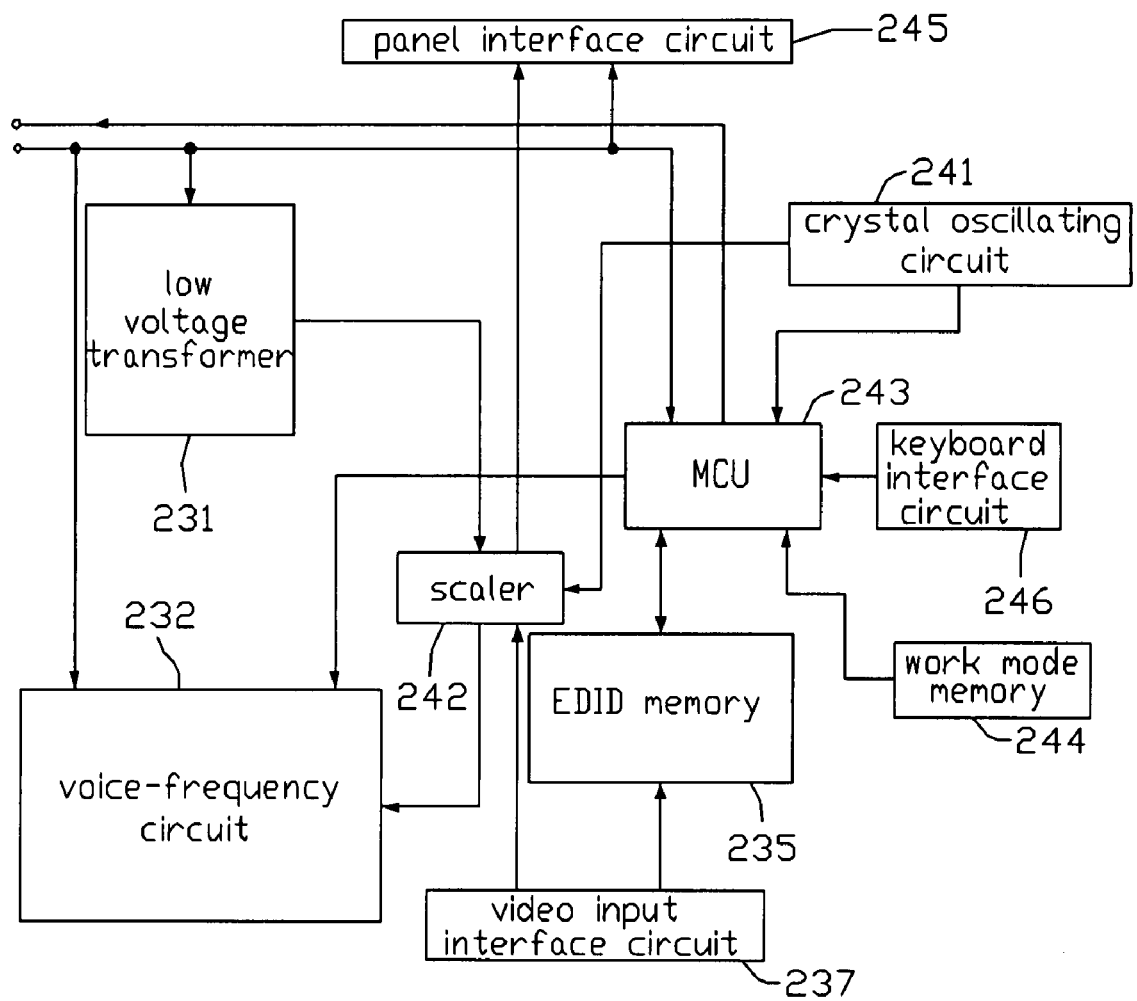
FIG. 2 is a diagram of the signal processing circuit of the PCB module of FIG. 1.

FIG. 2 is a diagram of the signal processing circuit 34. The signal processing circuit 34 includes a low voltage transformer 231, a voice-frequency circuit 232, an EDID memory 235, a video input interface circuit 237, a crystal oscillating circuit 241, a scaler 242, an MCU 243, a work mode memory 244, a panel interface circuit 245, and a keyboard interface circuit 246.

Operation voltages generated by the power source circuit 21 are provided to the low voltage transformer 231, the panel interface circuit 245, the MCU 243, and the voice-frequency circuit 232. The low voltage transformer 231 provides voltages to the scaler 242.

The video input interface circuit 237 receives video signals and a symbol signal from an external circuit, and respectively provides the video signals and the symbol signal to the scaler 242 and the EDID memory 235.

The scaler 242 receives the video signals from the video input interface circuit 237, and decodes the video signals to image data and sound signals. The image data are provided to the panel interface circuit 245. The sound signals are provided to the voice-frequency circuit 232.

The voice-frequency circuit 232 transforms the sound signals into audible sounds (including voice) by a speaker (not shown). Operation of the voice-frequency circuit 232 is controlled by the MCU 243.

The EDID memory 235 stores symbol information of the LCD. The EDID memory 235 also receives the symbol signal from the video input interface circuit 237, and provides the symbol information and the symbol signal to the MCU 243. The MCU 243 compares and identifies the symbol information and the symbol signal.

The work mode memory 244 stores parameters which correspond to at least one work mode of the LCD. The parameters can be provided to the MCU 243, thus the MCU 243 can adjust the work mode of the LCD.

The keyboard interface circuit 246 receives an interrupt signal from an adjusting button of the LCD when the adjusting button is pressed by a user. The interrupt signal is then provided to the MCU 243. Thus a contrast, brightness, and vertical and horizontal sizes of images displayed by the LCD panel can be adjusted by the MCU 243 when the user pushes the adjusting button and thus generates the interrupt signal.

The crystal oscillating circuit 241 generates a pulse clock signal having a state frequency, and provides the pulse clock signal to the MCU 243 and the scaler 242.

The panel interface circuit 245 provides the image data received from the scaler 242 and the operation voltages received from the power source circuit 21 to the LCD panel.

Figure 3:
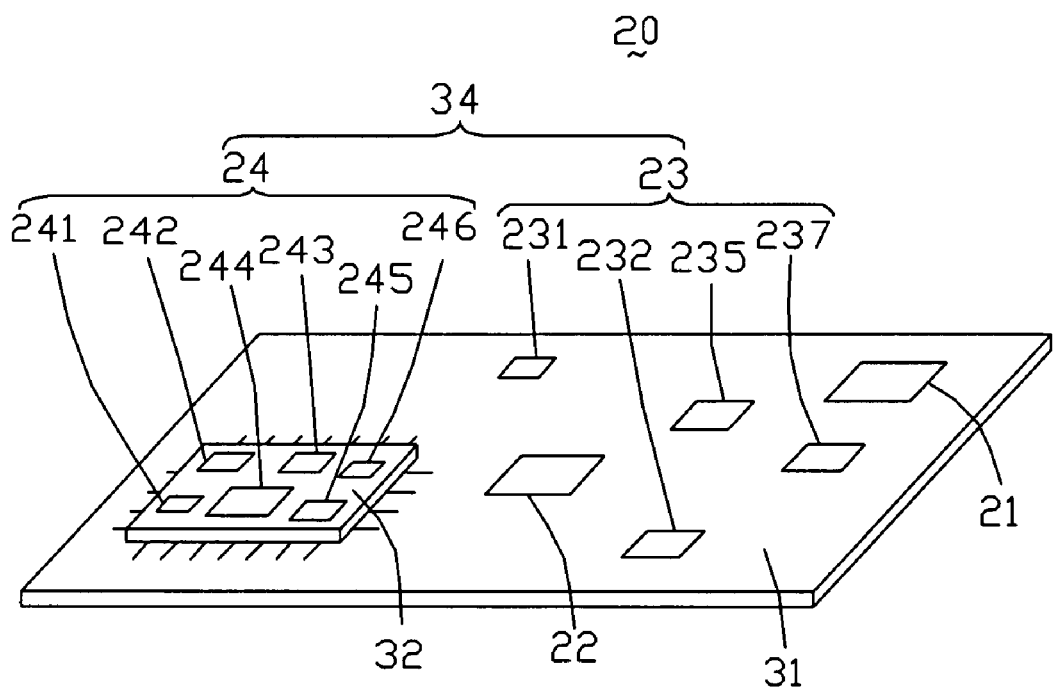
FIG. 3 is an isometric view of a layout of the circuits shown in FIGS. 1 and 2 on a PCB of the PCB module of the exemplary embodiment.
Figure 4:
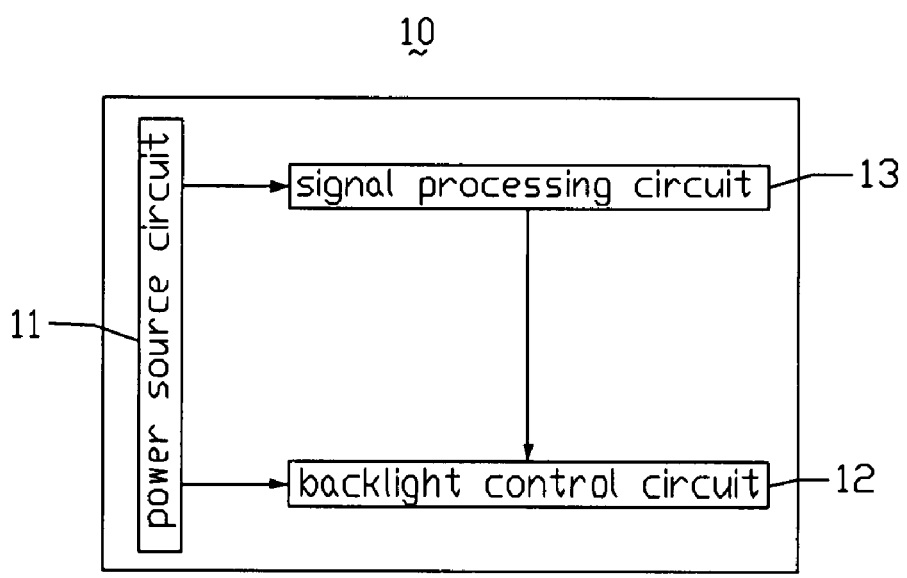
FIG. 4 is a block diagram of a conventional PCB module, the PCB module including a signal processing circuit.
Figure 5:
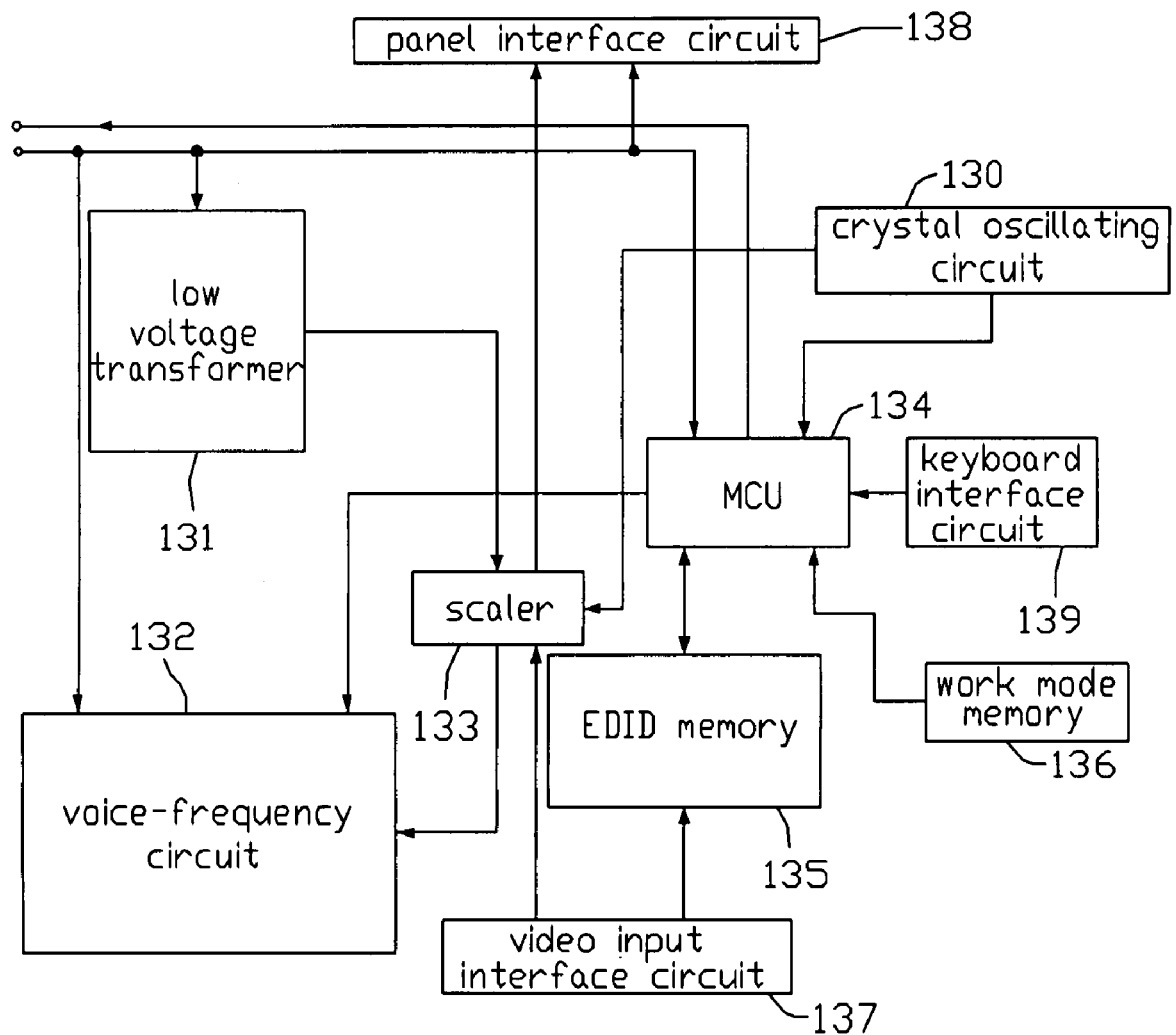
FIG. 5 is a circuit diagram of the signal processing circuit of the PCB module of FIG. 4.

FIG. 3 is an isometric view of a layout of the above-described circuits of the PCB module 20. The PCB module 20 includes a single-layer PCB 31 that has a large size, and a double-layer PCB 32 that has a small size. The double-layer PCB 32 includes a plurality of connecting pins (not visible), which are electrically connected to the single-layer PCB 31. Thereby, signals can be transmitted between the double-layer PCB 32 and the single-layer PCB 31.

The single-layer PCB 31 has the power source circuit 21, the backlight control circuit 22, and a first part 23 of the signal processing circuit 34. The first part 23 contains components of the signal processing circuit 34 which process low frequency signals. In particular, the first part 23 includes the low voltage transformer 231, the voice-frequency circuit 232, the EDID memory 235, and the video input interface circuit 237. The first part 23 generally has little or no need for a special anti-interference (e.g. anti-crosstalk) configuration. Thus even though the first part 23 is formed on the single-layer PCB 31, the first part 23 can still work normally.

The double-layer PCB 32 has a second part 24 of the signal processing circuit 34. The second part 24 contains components of the signal processing circuit 34 which process high frequency signals. In particular, the second part 24 includes the crystal oscillating circuit 241, the scaler 242, the MCU 243, the work mode memory 244, the panel interface circuit 245, and the keyboard interface circuit 246. The second part 24 generally has a great need for a special anti-interference (e.g. anti-crosstalk) configuration. Thus, with the second part 24 formed on the double-layer PCB 32, the second part 24 can work normally.

Because the power source circuit 21, the backlight control circuit 22, and the first part 23 of the PCB module 20 are formed on the single-layer PCB 31, and the second part circuit 24 of the PCB module 20 is formed on the double-layer PCB 32, the cost of the PCB module 20 is reduced compared with a conventional PCB module. Furthermore, the second part 24 generally having great demand for anti-interference is formed on the small-sized double-layer PCB 32. Thus the second part 24 can be easily redesigned or substituted with another kind of second part 24. Such redesigning or substitution can be performed without changing the layout of the large-sized single-layer PCB 31.

An alternative embodiment is as follows. The single-layer PCB 31 further includes a socket (not shown) corresponding to the plurality of connecting pins of the double-layer PCB 32. Thus the double-layer PCB 32 is electrically connected to the single-layer PCB 31 by inserting the connecting pins into the socket. In further alternative embodiments, the double-layer PCB 32 can be electrically connected to the single-layer PCB 31 via an FPCB (flexible printed circuit board) or via another kind of connector.

It is to be further understood that even though numerous characteristics and advantages of preferred and exemplary embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. A printed circuit board (PCB) module, comprising:
a single-layer PCB comprising a first part of a signal processing circuit, a power supply circuit configured for outputting operation voltages, and a backlight control circuit configured for driving a backlight of an LCD (liquid crystal display), the first part of the signal processing circuit comprising:
   a low voltage transformer, an EDID (extended display identification data) memory, a voice-frequency circuit, and a video input interface circuit; and
a double-layer PCB configured to be electrically connected to the single-layer PCB, the double-layer PCB comprising a second part of the signal processing circuit, the second part of the signal processing circuit comprising:
   a crystal oscillating circuit, a scaler, an MCU (micro controller unit), a work mode memory, a panel interface circuit, and a keyboard interface circuit;
wherein the crystal oscillating circuit is configured for generating a pulse clock signal having a state frequency and providing the pulse clock signal to the MCU and the scaler;
the low voltage transformer is configured for providing voltages to the scaler;
the video input interface circuit is configured for receiving video signals and a symbol signal from an external circuit and respectively providing the video signals and the symbol signal to the scaler and the EDID memory;
the scaler is configured for receiving the video signals from the video input interface circuit, decoding the video signals into image data and sound signals, and providing the image data to the panel interface circuit and the sound signals to the voice-frequency circuit;
the voice-frequency circuit is configured for transforming the sound signals into audible sounds using a speaker;
the EDID memory is configured for storing symbol information of the LCD, receiving the symbol signal from the video input interface circuit, and providing the symbol information and the symbol signal to the MCU, and the MCU is configured for identifying the symbol signal with the symbol information;
the work mode memory is configured for storing parameters which correspond to at least one work mode of the LCD, and the MCU is further configured for adjusting a work mode of the LCD according to the parameters;
the keyboard interface circuit is configured for receiving an interrupt signal generated by a user of the LCD, and providing the interrupt signal to the MCU, such that at least one of the following characteristics of an LCD display of the LCD is adjusted: contrast, brightness, vertical size, and horizontal size; and
the panel interface circuit is configured for providing the image signals received from the scaler and the operation voltages received from the power source circuit to the LCD panel.

2. The PCB module as claimed in claim 1, wherein the first part of the signal processing circuit contains components that process low frequency signals with little or no demand for an anti-interference configuration.

3. The PCB module as claimed in claim 1, wherein the second part of the signal processing circuit contains components that process high frequency signals with substantial demand for an anti-interference configuration.

4. The PCB module as claimed in claim 1, wherein the single-layer PCB further comprises an electrical socket, and the double-layer PCB comprises a plurality of connecting pins inserted into the socket such that the double-layer PCB is electrically connected to the single-layer PCB.

5. The PCB module as claimed in claim 1, wherein the double-layer PCB is electrically connected to the single-layer PCB through an FPCB (flexible printed circuit board).

6. The PCB module as claimed in claim 1, wherein the double-layer PCB is electrically connected to the single-layer PCB through an electrical connector.

7. The PCB module as claimed in claim 1, wherein the external circuit is a computer or a digital video disc (DVD) player.

8. The PCB module as claimed in claim 1, wherein operation of the voice-frequency circuit is controlled by the MCU.

9. A printed circuit board (PCB) module, comprising:
a single-layer PCB comprising a low voltage transformer, a video input interface circuit, and an EDID (extended display identification data) memory;
a double-layer PCB configured to be electrically connected to the single-layer PCB, the double-layer PCB comprising a crystal oscillating circuit, a scaler, an MCU (micro controller unit), a work mode memory, a panel interface circuit, and a keyboard interface circuit;
wherein the low voltage transformer is configured for providing voltages to the scaler;
the video input interface circuit is configured for receiving video signals and a symbol signal from an external circuit and respectively providing the video signals and the symbol signal to the scaler and the EDID memory;
the EDID memory is configured for storing symbol information of the LCD, receiving the symbol signal from the video input interface circuit, and providing the symbol information and the symbol signal to the MCU, and the MCU is configured for identifying the symbol signal with the symbol information;
the crystal oscillating circuit is configured for generating a pulse clock signal having a state frequency and providing the pulse clock signal to the MCU and the scaler;
the scaler is configured for receiving the video signals from the video input interface circuit, decoding the video signals into image data and sound signals, and providing the image data to the panel interface circuit and the sound signals to the voice-frequency circuit;
the work mode memory is configured for storing parameters which correspond to at least one work mode of the LCD, and the MCU is further configured for adjusting a work mode of the LCD according to the parameters;
the panel interface circuit is configured for providing the image signals received from the scaler and the operation voltages received from the power source circuit to the LCD panel; and
the keyboard interface circuit is configured for receiving an interrupt signal generated by a user of the LCD, and providing the interrupt signal to the MCU, such that at least one of the following characteristics of an LCD display of the LCD is adjusted: contrast, brightness, vertical size, and horizontal size.

10. The PCB module as claimed in claim 9, wherein the single-layer PCB further comprises a power supply circuit configured for outputting operation voltages to the low voltage transformer, the panel interface circuit, the MCU, and the voice-frequency circuit, and a backlight control circuit is configured for driving a backlight of an LCD (liquid crystal display).

11. The PCB module as claimed in claim 9, wherein the first part of the signal processing circuit further comprises a voice-frequency circuit configured for transforming the sound signals into audible sounds by a speaker.

12. The PCB module as claimed in claim 9, wherein the single-layer PCB further comprises an electrical socket, and the double-layer PCB comprises a plurality of connecting pins inserted into the socket such that the double-layer PCB is electrically connected to the single-layer PCB.

13. The PCB module as claimed in claim 9, wherein the double-layer PCB is electrically connected to the single-layer PCB through an FPCB (flexible printed circuit board).

14. The PCB module as claimed in claim 9, wherein the double-layer PCB is electrically connected to the single-layer PCB through an electrical connector.

* * * * *